(12) United States Patent
Ku et al.

(10) Patent No.: US 6,677,663 B1
(45) Date of Patent: Jan. 13, 2004

(54) END GRID ARRAY SEMICONDUCTOR PACKAGE

(75) Inventors: Jae Hun Ku, Seoul (KR); Jae Hak Yee, Singapore (SG)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,536

(22) Filed: Oct. 13, 2000

(Under 37 CFR 1.47)

(30) Foreign Application Priority Data

Dec. 30, 1999 (KR) .............................................. 99-65933

(51) Int. Cl.⁷ .............................................. H01L 23/495
(52) U.S. Cl. ........................ 257/666; 257/672; 257/673; 257/676; 257/690; 257/692
(58) Field of Search ................................. 257/666, 672, 257/673, 676, 692, 726, 778, 796, 690, 730; 438/123, 117, 106, 127, 108

(56) References Cited

U.S. PATENT DOCUMENTS

| | | | |
|---|---|---|---|
| 4,530,152 A | 7/1985 | Roche et al. | 29/588 |
| 5,041,902 A | 8/1991 | McShane | 357/79 |
| 5,157,480 A | 10/1992 | McShane et al. | 357/74 |
| 5,172,213 A | 12/1992 | Zimmerman | 257/796 |
| 5,172,214 A | 12/1992 | Casto | 257/676 |
| 5,278,446 A | 1/1994 | Nagaraj et al. | 257/707 |
| 5,428,248 A | 6/1995 | Cha | 257/676 |
| 5,521,429 A | 5/1996 | Aono et al. | 257/676 |
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,866,939 A * | 2/1999 | Shin et al. | 257/676 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,025,640 A * | 2/2000 | Yagi et al. | 257/676 |
| 6,130,115 A * | 10/2000 | Okumura et al. | 257/787 |
| 6,143,981 A | 11/2000 | Glenn | 174/52.4 |
| 6,198,171 B1 * | 3/2001 | Huang et al. | 257/787 |
| 6,211,462 B1 * | 4/2001 | Carter, Jr. et al. | 257/666 |
| 6,225,146 B1 * | 5/2001 | Yamaguchi et al. | 438/123 |
| 6,229,200 B1 | 5/2001 | Mclellan et al. | 257/666 |
| 6,242,281 B1 | 6/2001 | Mclellan et al. | 438/106 |
| 6,281,568 B1 * | 8/2001 | Glenn et al. | 257/684 |
| 6,294,100 B1 | 9/2001 | Fan et al. | 216/14 |
| 6,355,502 B1 | 3/2002 | Kang et al. | 438/110 |
| 6,448,633 B1 * | 9/2002 | Yee et al. | 257/666 |
| 2001/0008305 A1 * | 7/2001 | McLellan et al. | 257/692 |

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |

(List continued on next page.)

Primary Examiner—Tom Thomas
Assistant Examiner—Quang Vu
(74) Attorney, Agent, or Firm—Stetina Brunda Garred & Brucker

(57) ABSTRACT

A lead end grid array semiconductor package comprises a leadframe having a plurality of leads. The leads extend outwardly from a chip paddle and have an outer end that defines an outer perimeter of the leadframe. A plurality of inner protrusions and outer protrusions are located on a lower surface of the leads. The outer protrusions communicate with the outer perimeter of the leadframe. An encapsulating material encapsulates the semiconductor chip and the conductive wires to form the semiconductor package. Solder balls are attached to a lower surface of the protrusions. The protrusions on the perimeter of the leadframe enable the semiconductor package to be positioned on a flat heat block when affixing the conductive wires to bond pads in the semiconductor chip. A ball of conductive material is affixed to the lower end of the protrusions to form a ball grid array.

5 Claims, 3 Drawing Sheets

FOREIGN PATENT DOCUMENTS

| | | |
|---|---|---|
| JP | 63-205935 | 8/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| JP | 63-233555 | 9/1998 |
| KR | 92-10286 A | 6/1992 |
| KR | 92-10286 B | 11/1992 |
| KR | 96-9774 A | 3/1996 |
| KR | 96-9774 B | 7/1996 |

* cited by examiner

END GRID ARRAY SEMICONDUCTOR PACKAGE

BACKGROUND OF THE INVENTION

1. Field of the Invention

The present invention relates to lead end grid array semiconductor packages, and, more particularly to a lead end grid array semiconductor package having a leadframe with a plurality of leads wherein each lead is provided with a protrusion on the lower surface and outer end of each lead.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

The requirement for such semiconductor packages has resulted in developments of semiconductor packages having a structure in which leads are exposed on the bottom of an encapsulate at respective lower surfaces thereof. Such a semiconductor package is called a "lead end grid array semiconductor package. Currently, the demand for semiconductor packages having such a structure is increasing.

However, a typical lead end grid array semiconductor package has a partially etched structure at the lower surfaces of the outer lead ends that may result in a separation of bonding wires during a wire bonding process involved in the fabrication of the semiconductor package. Additionally, during the molding process a less than ideal clamping may occur during the fabrication of the semiconductor package. The deficiency in clamping may be due to variations in flatness at a lower surface because the lower surfaces of the outer ends of the leads are partially etched. Due to these variations in flatness, the leads may have a non-uniform flatness during a wire bonding process that is conducted at a high temperature and a high pressure even though the lower surfaces of the outer lead ends are supported by a heat block adapted to support a leadframe carrying those leads. For this reason, bonding wires may be insecurely bonded or rise at their ends. As a result, a separation of those bonding wires may occur. In the molding process conducted at a high temperature and a high pressure, a degraded clamping may also occur due to the non-uniform flatness of the leads caused by the etching process. Poor clamping may result in lands on the ends of protrusions that extend from the lower surface of the leads which may become buried in the resin encapsulate. Another undesirable result is that the molding resin may leak from the encapsulating region. As a result, a degraded package maybe produced.

BRIEF SUMMARY OF THE INVENTION

The present invention relates to a lead end grid array semiconductor package of improved design and reliability. More particularly, the present invention relates to a lead end grid array semiconductor package that comprises a leadframe having a chip paddle and a semiconductor chip located on the chip paddle. A plurality of leads are present on the leadframe body. Conductive wires are provided for electrically connecting the leads to bond pads on the semiconductor chip. The leads extend outwardly from the chip paddle, and each of the leads has an outer end that defines an outer perimeter of the leadframe. A plurality of inner protrusions and outer protrusions are located on a lower surface of the leads. The outer protrusions communicate with the outer perimeter of the leadframe. An encapsulate encapsulates the semiconductor chip and the conductive wires to form the semiconductor package. Solder balls are attached to a lower surface of the protrusions. To form the semiconductor package, a plurality of leads are formed on the leadframe and a plurality of protrusions are formed on a lower surface of the leads, wherein at least one of the protrusions is in communication with a perimeter of the leadframe. To affix the conductive wires to bond pads, the leadframe is positioned on a flat heat block. A ball of conductive material is affixed to the lower end of the protrusions to form the ball grid array.

In another aspect, the above described present invention includes encapsulating the semiconductor chip, wires and leads in an encapsulating material. The leads may be arranged along the edges of the chip paddle.

BRIEF DESCRIPTION OF THE DRAWINGS

A more complete understanding of the method and apparatus of the present invention may be obtained by reference to the following detailed description with like reference numerals denoting like elements, when taken in conjunction with the accompanying Drawings wherein.

DETAILED DESCRIPTION OF THE INVENTION

Figure 1:
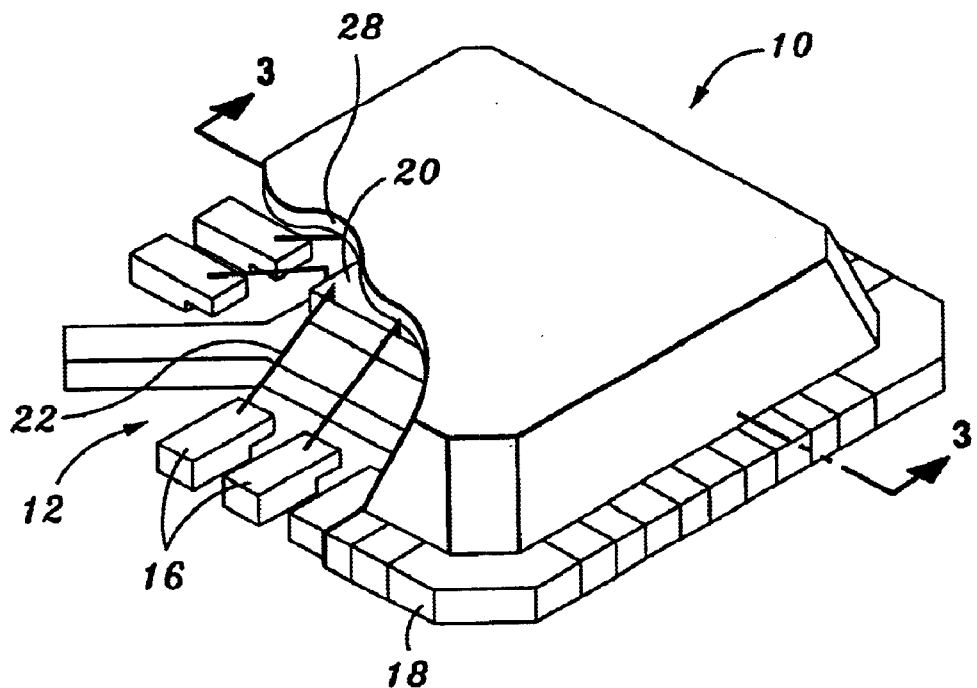
FIG. 1 is a top cut-away perspective view of a semiconductor package of an embodiment of the present invention showing the top view of a plurality of leads extending outwardly from a chip paddle.
Figure 2:
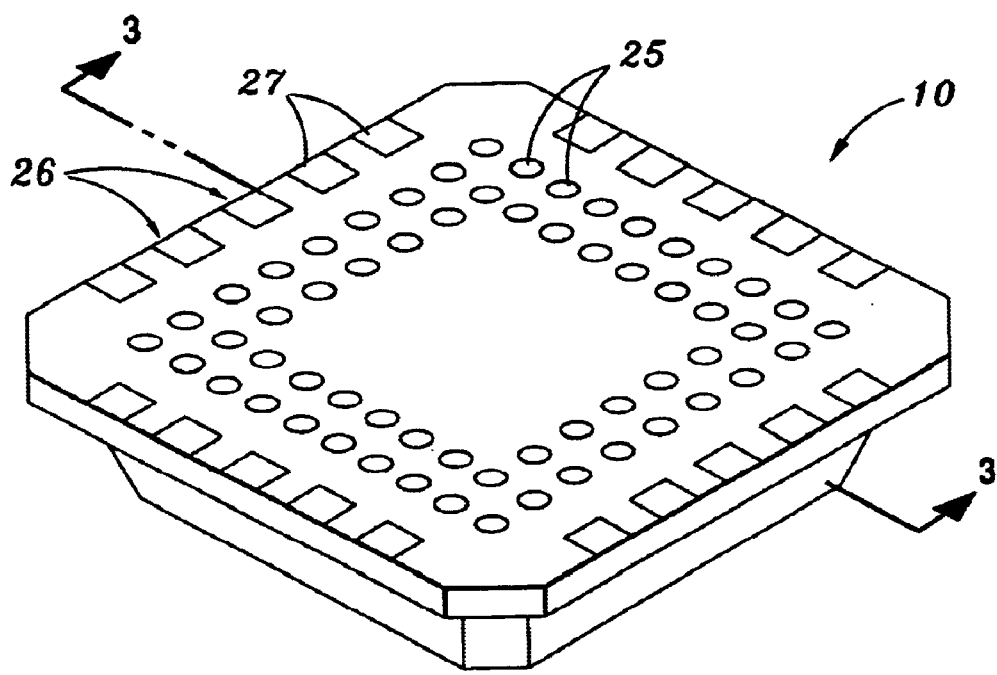
FIG. 2 is a bottom perspective view of the semiconductor package of FIG. 1 showing the lower surface thereof, and more particularly, showing a lower surface of inner and outer protuberances.
Figure 3:
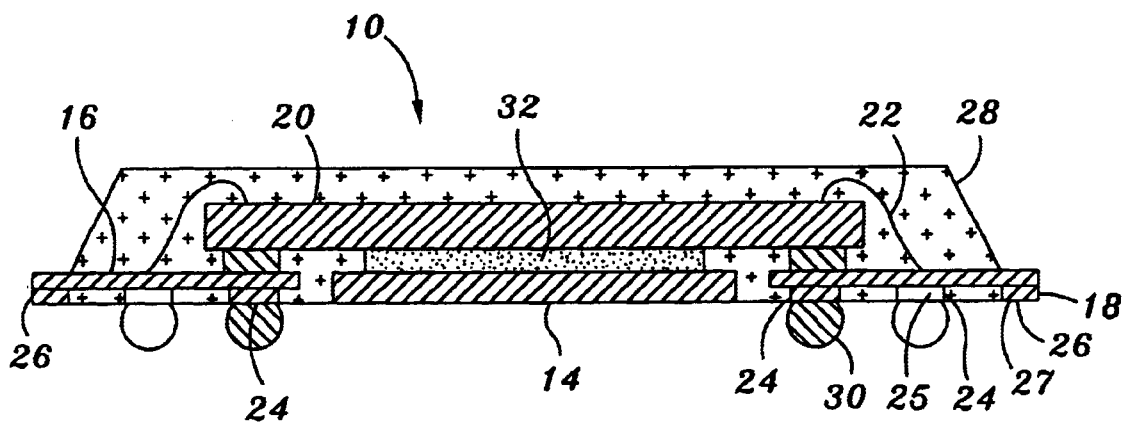
FIG. 3 is a side elevational, cross-sectional view illustrating a lead end grid array semiconductor package according to the present invention.

Referring first to FIGS. 1 through 3 in combination, the lead end grid array semiconductor package of the present invention is designated generally as 10. Semiconductor package 10 comprises a leadframe 12 with a chip paddle 14 (FIG. 3) formed thereon. Leadframe 12 additionally includes a plurality of leads 16 and an outer perimeter 18. Leads 16 are spaced apart from chip paddle 14 and are arranged along all four edges of chip paddle 14 and extend outwardly therefrom. A semiconductor chip 20 is positioned upon the chip paddle 14. A plurality of conductive wires 22 extend from the semiconductor chip 20 for making electrical connection with leads 16. The upper surfaces of leads 16 may be electroplated with a material that enhances electrical conductivity such as, for example, gold or silver. A plurality of inner protrusions 24 (FIG. 3) extend from a lower surface of leadframe 12. Inner protrusions 24 have conducting surfaces or solder ball lands 25 on a lower end thereof. Inner protrusions 24 may be a filler material added to voids in encapsulating material 28. Additionally, inner protrusions 24 may be formed by a partial etching process of a lower surface of leadframe 12. In a preferred embodiment, an end protrusion 26 communicates with perimeter 18 of leadframe 12. End protrusion 26 has a conducting surface 27 on a lower end thereof. The leadframe 12, chip paddle 14, leads 16, semiconductor chip 20 and conductive wires 22 of the semiconductor package 10 are encapsulated within an encapsulating material 28 which may be thermoplastics or thermoset resin, with the thermoset resin including silicones, phenolics, and epoxies. Preferably, conducting surfaces 25, 27 remain unencapsulated after the encapsulation step. To minimize corrosion, conducting surfaces 25, 27 may, but do not necessarily have to be, electroplated with the lead, tin, gold nickel, nickel palladium, tin bismuth, or other similar materials known in the art.

Figure 4:
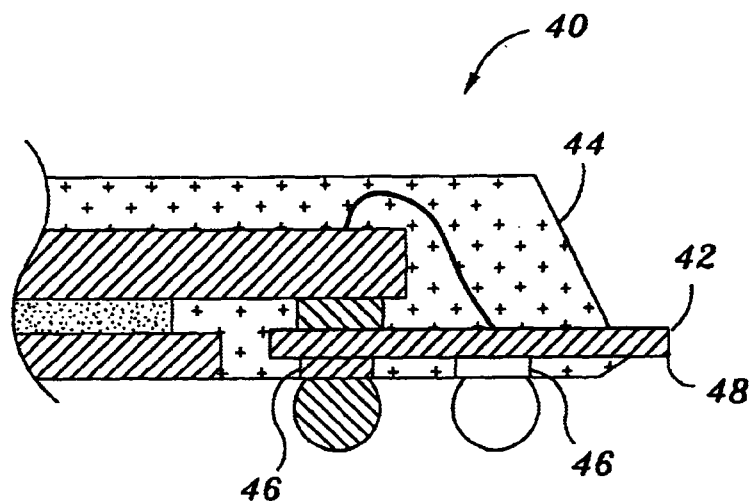
FIG. 4 is a partial side elevational, cross-sectional view illustrating a conventional lead end grid array semiconductor package.

Referring now to FIG. 3, a cross-sectional view of FIGS. 1 and 2 is taken along lines 3—3 of FIGS. 1 and 2. Inner protrusions 24, and end protrusions 26 extend downwardly from a bottom surface of leadframe 12. Conducting surfaces 25, 27 provide an attachment point for solder balls 30. (FIGS. 2 and 4). An electrical insulator 32 (FIG. 3) is provided to prevent the leads 16 and the semiconductor chip 20 from coming into electrical contact with one another. Electrical insulator 32 may be a double sided polyimide tape or an insulating polymer resin adhesive such as an epoxy resin adhesive.

The inner protrusions 24 have conducting surfaces or solder ball lands 25 formed on their lower surfaces. The solder ball lands 25 remain exposed after components are encapsulated by encapsulating material 28. The solder balls 30 are used as external input/output terminals. The solder balls 30 are attached to the solder ball lands or conducting surfaces 25 of selected inner protrusions 24. In the preferred embodiment, a portion of the lower surface of each lead 16 is not etched at an outer end. Therefore, the lower surface of lead 16 has an end protrusion 26 formed thereon.

The end protrusion 26 at the outer end of each lead 16 is horizontally flush with inner protrusions 24. Therefore, when leadframe 12 is set upon a flat surface, the leadframe 12 has good stability since end protrusions 26, which are located on the outer perimeter 18, provide a wide base. Since the end protrusions 26 are present, the leadframe 12 may be uniformly supported in a horizontal state by a flat heat block 31 (FIG. 5) during manufacture prior to the addition of solder balls 30. Therefore, it is possible to eliminate stability and misalignment problems involved in a conventional structure (See FIG. 4).

Referring now to FIG. 4, shown is a partial cross-sectional view of a conventional semiconductor package 40. As can be seen in FIG. 4, the leadframe 42 extends outwardly from encapsulating material 44. Protrusions 46 extend downwardly from leadframe 42. However, the end 48 of leadframe 42 is partially etched, i.e., has no end protrusion. Such a partially etched structure at the lower surface of the outer lead ends may result in separation of bonding wires during a wire bonding process involved in the fabrication of the semiconductor package. Further, without end protrusions, the semiconductor package has a less stable base than semiconductor package 10.

Figure 5:
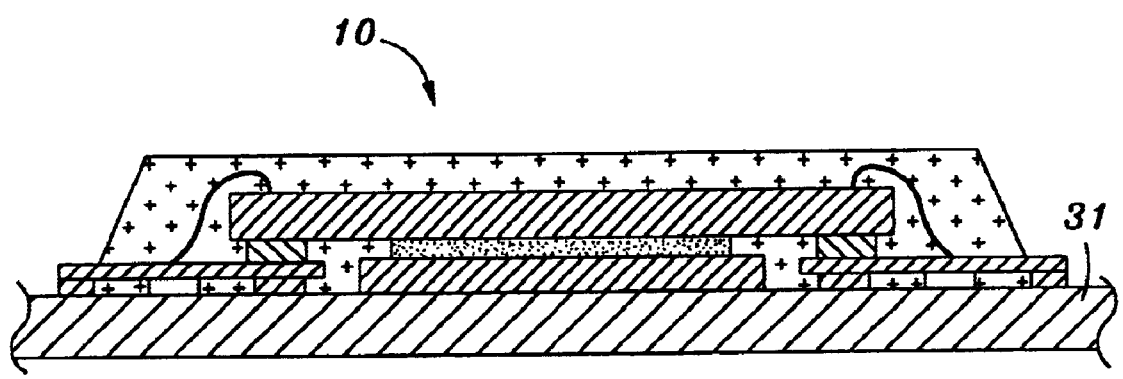
FIG. 5 is a side elevational, cross-sectional view illustrating the semiconductor package of FIG. 3 positioned on a flat heat block prior to the addition of conductive material to the protrusions.

The present invention has numerous advantages. One such advantage is that a more uniform lower surface of leadframe 12 is produced by providing an end protrusion 26 and inner protrusions 24. The contact area provided by the end protrusion 26 and inner protrusions 24 allow for a uniform clamping pressure to be applied to a bottom mold die during a molding process, which is typically conducted following a wire bonding process, as is known in the art. A semiconductor package that exhibits a variation in flatness may result in bonding wires being insecurely bonded during the wire bonding process, which is conducted at a high temperature and a high pressure, even though the lower surfaces of the outer lead ends are supported by a heat block that is adapted to support a leadframe carrying those leads. Therefore, it is possible to avoid a leakage of encapsulating material 28 from the mold, which may be caused by a non-uniform thickness of the leadframe 12. Additionally, the more uniform lower surface of the leadframe 12 allows for the prevention of solder ball lands 25 on protrusions 24 from being covered by encapsulating material 28. Therefore, subsequent processes, such as deflashing the semiconductor package 10, can be more easily and efficiently conducted. In some cases, the deflash process may be eliminated entirely. Finally, specially configured wire bonding and molding devices that have heat block and bottom mold die with peripheral spaced protruding edges may be eliminated. The present invention allows for the use of a flat heat block 31, as shown in FIG. 5.

As is apparent from the above description, the present invention provides a lead end grid array semiconductor package that has a leadframe provided with a protrusion on a lower surface thereof at the outer end of each lead in addition to inner protrusions arranged on the leads. Therefore, each lead as well as the leadframe has a wide platform of contact area at its lower surface. The wide platform is beneficial in preventing a separation of bonding wires or misalignment when clamping the semiconductor package.

The following applications are all being filed on the same date as the present application and all are incorporated by reference as if wholly rewritten entirely herein, including any additional matter incorporated by reference therein:

| application Ser. No. | Title of Application | First Named Inventor |
| --- | --- | --- |
| 09/687,787 | Thin and Heat Radiant Semiconductor Package and Method for Manufacturing | Jae Hun Ku |
| 09/687,331 | Leadframe for Semiconductor Package and Mold for Molding the Same | Young Suk Chung |
| 09/687,532 | Method for Making a Semiconductor Package Having Improved Defect Testing and Increased Production Yield | Tae Heon Lee |
| 09/687,876 | Near Chip Size Semiconductor Package | Sean Timothy Crowley |
| 09/687,048 | Leadframe and Semiconductor Package with Improved Solder Joint Strength | Tae Heon Lee |
| 09/687,585 | Semiconductor Package Having Reduced Thickness | Tae Heon Lee |
| 09/687,541 | Semiconductor Package Leadframe Assembly and Method of Manufacture | Young Suk Chung |
| 09/687,049 | Method for Making Semiconductor Packages | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the present invention.

What is claimed is:

1. A leadframe for use in a semiconductor package, the leadframe comprising:

a chip paddle;

a plurality of leads extending at least partially about the chip paddle in spaced relation thereto, each of the leads having:

an outer end;

opposed, generally planar upper and lower surfaces;

at least one end protrusion formed on the lower surface and extending to the outer end, the end protrusion defining a first lower land surface; and at least two inner protrusions formed on the lower surface in spaced relation to each other and to the end protrusion, the inner protrusions each defining a second lower land surface which extends in generally coplanar relation to the first lower land surface.

2. The leadframe of claim 1 wherein the end and inner protrusions of each of the leads extend perpendicularly downward from the lower surface thereof.

3. The leadframe of claim 2 wherein the end protrusion of each of the leads has a quadrangular configuration.

4. A semiconductor package, comprising:

a leadframe comprising:

a chip paddle;

a plurality of leads extending at least partially about the chip paddle in spaced relation thereto, each of the leads having:

opposed, generally planar upper and lower surfaces and an outer end;

at least one end protrusion formed on the lower surface and extending to the outer end; and at least two inner protrusions formed on the lower surface in spaced relation to each other and to the end protrusion;

a semiconductor chip attached to the chip paddle and electrically connected to at least one of the leads; and an encapsulating material at least partially encapsulating the leadframe and the semiconductor chip such that a surface of each of the end and inner protrusions of each of the leads is coplanar with a surface of the sealing material.

5. The semiconductor package of claim 4 wherein:

the end and inner protrusions of each of the leads each define a lower land surface; and the lower land surfaces of the end and inner protrusions of each of the leads extend in generally co-planar relation to each other.

* * * * *